US 9,779,349 B2

(12) United States Patent
Rogy et al.

(10) Patent No.: US 9,779,349 B2
(45) Date of Patent: Oct. 3, 2017

(54) METHOD OF PRODUCING A TRANSPONDER AND A TRANSPONDER

(71) Applicant: NXP B.V., Eindhoven (NL)

(72) Inventors: Reinhard Rogy, Graz (AT); Christian Zenz, Graz (AT)

(73) Assignee: NXP B.V., Eindhoven (NL)

( * ) Notice: Subject to any disclaimer, the term of this patent is extended or adjusted under 35 U.S.C. 154(b) by 274 days.

(21) Appl. No.: 14/607,517

(22) Filed: Jan. 28, 2015

(65) Prior Publication Data

US 2015/0144704 A1 May 28, 2015

Related U.S. Application Data

(62) Division of application No. 12/095,147, filed as application No. PCT/IB2006/054408 on Nov. 23, 2006, now Pat. No. 8,968,510.

(30) Foreign Application Priority Data

Nov. 28, 2005 (EP) .................................... 05111388

(51) Int. Cl.
*G06K 19/06* (2006.01)
*G06K 19/077* (2006.01)
*H01L 23/00* (2006.01)

(52) U.S. Cl.
CPC . *G06K 19/07754* (2013.01); *G06K 19/07743* (2013.01); *G06K 19/07745* (2013.01); *G06K 19/07749* (2013.01); *G06K 19/07752* (2013.01); *H01L 24/24* (2013.01); *H01L 24/82* (2013.01); *H01L 2224/24226* (2013.01); *H01L 2924/014* (2013.01); *H01L 2924/01033* (2013.01); *H01L 2924/01078* (2013.01);
(Continued)

(58) Field of Classification Search
CPC ....... G06K 19/07754; G06K 19/07743; G06K 19/07745; G06K 19/07749; G06K 19/07752; H01L 24/24; H01L 24/82; H01L 2924/01033; H01L 2924/01078; H01L 2924/01082; H01L 2924/014; H01L 2924/14; H01L 2924/19041; H01L 2924/19043; H01L 2924/3105; H01L 2224/24226; Y10T 29/49018
USPC ......................................... 235/492; 340/10.1
See application file for complete search history.

(56) References Cited

U.S. PATENT DOCUMENTS 5,255,839 A 10/1993 da Costa Alves et al.
5,468,999 A 11/1995 Lin et al.
(Continued)

FOREIGN PATENT DOCUMENTS

EP 1 460 690 A1 9/2004
WO 2004/051701 A2 6/2004

OTHER PUBLICATIONS

International Search Report for Patent Appln. No. PCT/IB2006/054408 (Apr. 26, 2007).

*Primary Examiner* — Laura Gudorf

(57) ABSTRACT

In a method of producing a transponder (T1, T2, T3), a substrate (1, 91) is provided. The substrate (9, 91) comprises a first area (2), a second area (3) adjacent to the first area (2), and a first electric contact (8, 98) adjacent to the second area (3). An electric device (50, 80) is placed in or on the first area (2), preferably without touching the first electric contact (8, 98). Subsequently, a conductive glue (12) is applied on the second area (3) and on the first electric contact (8, 98) so that the conductive glue (12) electrically couples the first electric contact (8, 98) with the electric device (50, 80).

9 Claims, 4 Drawing Sheets

(52) U.S. Cl.
    CPC    *H01L 2924/01082* (2013.01); *H01L 2924/14* (2013.01); *H01L 2924/19041* (2013.01); *H01L 2924/19043* (2013.01); *H01L 2924/30105* (2013.01); *Y10T 29/49018* (2015.01)

(56) References Cited

U.S. PATENT DOCUMENTS

| | | |
|---|---|---|
| 5,798,146 A | 8/1998 | Murokh et al. |
| 6,040,235 A | 3/2000 | Badehi |
| 6,091,332 A | 7/2000 | Eberhardt et al. |
| 6,107,920 A | 8/2000 | Eberhardt et al. |
| 6,320,753 B1 | 11/2001 | Launay |
| 6,351,025 B1 | 2/2002 | Ohsawa et al. |
| 6,400,006 B2 | 6/2002 | Neu et al. |
| 6,404,643 B1 | 6/2002 | Chung |
| 6,853,087 B2 | 2/2005 | Neuhaus et al. |
| 6,864,570 B2 | 3/2005 | Smith |
| 6,867,983 B2 | 3/2005 | Liu et al. |
| 6,891,110 B1 | 5/2005 | Pennaz et al. |
| 2002/0038925 A1 | 4/2002 | Reimer |
| 2004/0125040 A1 | 7/2004 | Ferguson et al. |
| 2004/0150104 A1 | 8/2004 | Terui |
| 2004/0207049 A1 | 10/2004 | Bauer et al. |

METHOD OF PRODUCING A TRANSPONDER AND A TRANSPONDER

CROSS-REFERENCE TO RELATED APPLICATION

This application is a division of co-pending application Ser. No. 12/095,147, filed on Nov. 23, 2006, which is the national stage of international patent application no. PCT/IB2006/054408 filed Nov. 11, 2006, which claims priority under 35 U.S.C. §119 of European patent application no. 05111388.4, filed on Nov. 28, 2005, the contents of which are incorporated by reference herein.

FIELD OF THE INVENTION

The invention relates to a method of producing a transponder, and to a transponder.

BACKGROUND OF THE INVENTION

U.S. Pat. No. 6,867,983 B2 discloses an electric circuit in the form of a transponder referred to as radio frequency identification (RFID) transponder used as an RFID tag or label. The tag or label includes a device substrate, on which an antenna with two ends is formed, and a strap substrate. When producing the tag or label, the antenna is first formed on the device substrate and then a conductive adhesive is placed on the antenna ends. The microstructure element is placed in a recess of the strap substrate by means of an FSA process, and leads are plated on the strap substrate. Finally, the strap substrate is mounted on the device substrate, with the leads of the strap substrate being in contact with the antenna ends, thus coupling the antenna with the microstructure element.

OBJECT AND SUMMARY OF THE INVENTION

It is an object of the invention to provide a method of producing a transponder, which allows attachment of an electric device of the transponder to the substrate in a simpler manner.

According to the invention, this object is achieved by means of a method of producing a transponder, the method comprising the steps of: providing a substrate which comprises a first area, a second area adjacent to the first area, and a first electric contact being attached on the substrate adjacent to the second area; placing an electric device in or on the first area; and applying a conductive glue on the second area and/or on the first electric contact so that the conductive glue electrically couples the first electric contact with the electric device. According to the prior art, a transponder is usually manufactured by first applying the conductive glue on the substrate and then placing the electric device on the substrate. The electric device is then likely to float on the conductive glue, requiring a special device which presses the electric device on the substrate while the conductive glue is curing. According to the inventive method, however, the electric device, which may be an integrated circuit, is first placed in or on the first area and then the conductive glue is applied on the second area and on the first electric contact. Thus, the electric device is not likely to float on the conductive glue and can cure without a special device pressing the electric device on the substrate. The first electric contact may be attached on the substrate by forming the first electric contact on the substrate. The first electric contact may be formed by means of any one of a variety of suitable methods, such as printing of conductive ink, plating, or other methods of selective metal deposition.

According to a preferred alternative, said electric device is placed in or on said first area without touching said first electric contact. In doing so, unwanted stray capacitance between the contacts and the electric device is avoided or at least reduced. However, said electric device may also cover said second area and even, at least partly, the first electric contact.

Before the electric device is placed on the substrate, the substrate may be conditioned so that the first area has a first wettability and the second area has a second wettability which is higher than the first wettability. The first area is preferably conditioned so that it even repels the conductive glue, and the second area is preferably conditioned so that it attracts the conductive glue. The different degrees of wettability of the substrate may be obtained by appropriately structuring the substrate. During manufacture of the substrate, the first and the second area of the substrate may be obtained by means of an appropriate surface treatment, such as plasma or corona treatment, imprinting techniques, such as nano-imprinting, by composition of additional material layers, a sputtering process, a vapor-deposition process, or by printing a layer having the respective wettability on the respective area, or applying a layer of silicon. Suitable materials for the substrate include polycarbonate, polyvinyl chloride, polyethylene terephthalate (PET), or even ceramics and paper. Particularly, if the substrate is made of a material having a relatively high wettability, such as PET, only the first area of the substrate needs to be treated, utilizing, for instance, one of the above-mentioned techniques so that the first area has the first wettability. Since the first electric contact is preferably made of a metallic material, its associated area may inherently have a relatively high wettability. Otherwise, the surface of the first electric contact has to be treated appropriately.

In a restricted version of the inventive method, the electric device has a bottom surface, a top surface, and a plurality of side surfaces, at least one of which comprises electric contacts. Since the electric contacts of the electric device are on a side surface, the electric device is advantageously placed in or on the first area in such a way that the side surface comprising the electric contacts faces the first electric contact. Thus, it is unnecessary to have the conductive glue flow under the electric device, which results in a decreased height of the finished transponder. The electric contacts may also be on the top surface of the electric device.

At least the side surface facing the first electric contact may be inclined with respect to the bottom surface of the electric device. This enhances the adhesive bonding of the electric device on the substrate. Particularly, a form-fit can be obtained if the conductive glue is partly applied on the top surface of the electric device. Moreover, the electric device is forced towards the substrate during assembly because the surface tension and/or the weight of the conductive glue acting on the inclined side walls also result in a force component towards the substrate. Finally, the electric device has a reduced tendency of initiating cracks when the device is bent. However, the bottom surface may also have the same size as the top area or may be smaller than the top surface.

In a further restricted version of the inventive method, the substrate comprises a third area adjacent to the first area, and a second electric contact is attached on the substrate adjacent to the third area. Preferably, the substrate to be provided may be conditioned in such a way that the third area has a third wettability and the first wettability is lower than the second and the third wettability. Although embodiments including up to only two contacts have been presented so far, it will be evident to those skilled in the art that, in principle, the invention also applies to devices with more than two contacts.

The substrate may have an antenna attached thereon and the antenna may comprise at least one antenna end represented by the first electric contact. The substrate, however, may also be a first substrate, and the inventive method may comprise the following additional steps: mounting the first substrate on a second substrate on which an antenna with at least one antenna end is attached and electrically coupling the first electric contact with the at least one antenna end.

If the antenna is attached on the substrate, the inventive transponder produced by means of the inventive method may comprise a second electric contact, and the antenna may have a first and a second contact end. The first contact end then represents the first electric contact and the second contact end represents the second electric contact. The substrate may have the second and the third area with a relatively high wettability so that these areas preferably attract the conductive glue. The first area having the low wettability is located between the second and the third area. In this version of the inventive transponder, the areas and the antenna may be designed in such a way that the electric device is placed in or on the first area between the two ends of the antenna. Since the first area has a lower wettability than the remaining areas, the conductive glue wets, on the one hand, at least to a great extent, only the second and the third area, as well as the two electric contacts. On the other hand, particularly if the electric device is placed at least partly on the second and the third area of the substrate, the conductive glue will also touch and stick to the side surfaces facing the first and the second antenna end, respectively. Due to the surface tension (and in the case of inclined side walls also the weight) of the conductive glue placed on the second and the third area, the conductive glue will center the electric device automatically, or center it at least to a certain extent. This eases the process of manufacturing the inventive transponder, because it relaxes a precise centering of the electric device when assembling the inventive transponder. Additionally, since the electric device is centered automatically, or centered at least to a certain extent, by the conductive glue, the electric device does not need to be fixed externally during curing and hardening of the conductive glue. To avoid or at least reduce unwanted stray capacitance, the electric device preferably does not overlap the two antenna ends.

These and other aspects of the invention are apparent from and will be elucidated with reference to the embodiments described hereinafter.

BRIEF DESCRIPTION OF THE DRAWINGS

The invention will be described in greater detail hereinafter, by way of non-limiting examples, with reference to the embodiments shown in the drawings.

DESCRIPTION OF EMBODIMENTS

Figure 1:
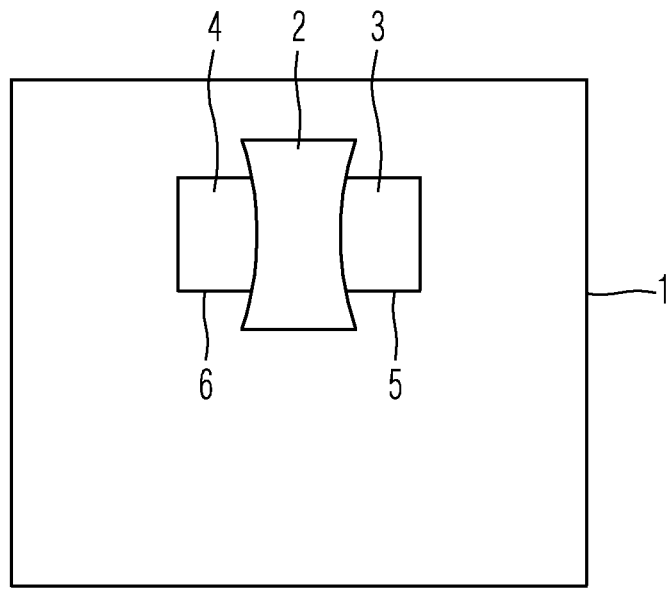
FIG. 1 shows a substrate for a first example of a transponder.
Figure 2:
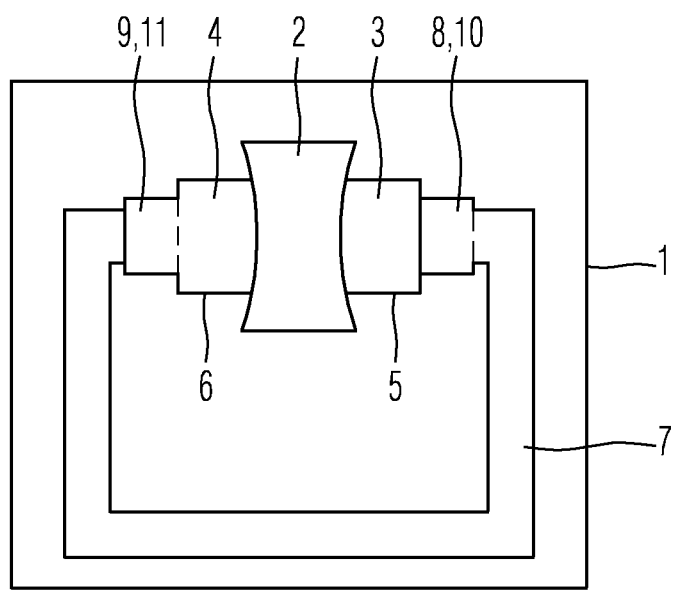
FIGS. 2 to 4 illustrate the process of manufacturing the first transponder.
Figure 3:
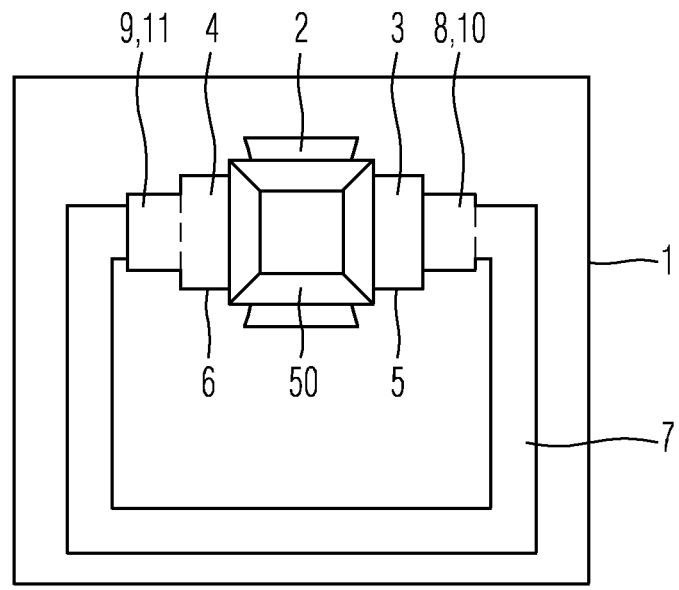
Figure 4:
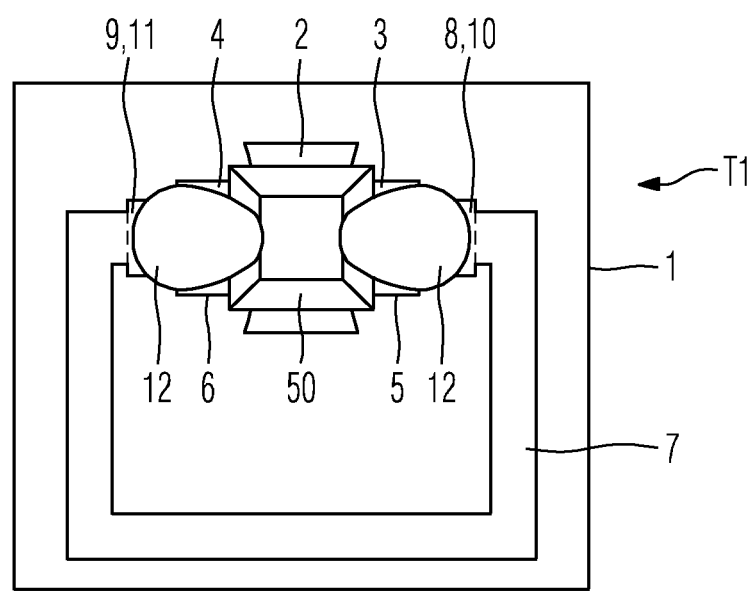
Figure 7:
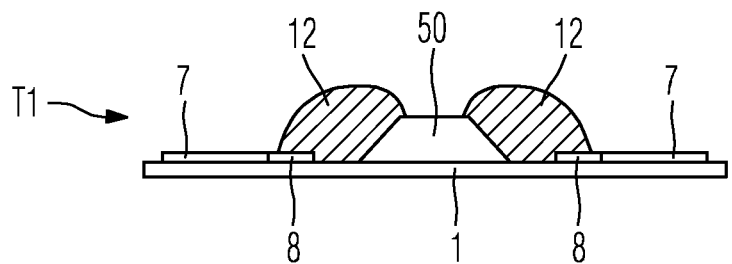
FIG. 7 is a side view of the first transponder.

FIG. 1 is a top view of a substrate 1 used for manufacturing a first example of a transponder T1 whose manufacturing process is illustrated in FIGS. 1 to 4. The transponder T1 is depicted in FIGS. 4 and 7. The substrate 1 is made of polyethylene terephthalate (PET) and the top surface of the substrate 1 has a relatively high wettability so that it attracts a conductive glue relatively well in the embodiment shown. Reference is made hereinafter to conductive glue. However, solder may be used alternatively for the embodiments of the invention. For manufacturing the transponder T1, the substrate 1 is first structured during a sputtering process. During the sputtering process, an area 2 having a relatively low wettability is formed on the top surface of the substrate 1 so that it repels the afore-mentioned conductive glue. Additionally, further areas 3 and 4 are created on the top surface of the substrate 1. These areas 3, 4 are basically untreated, but are limited by small trenches 5, 6 etched or imprinted into the top surface of the substrate 1 in the embodiment shown. Consequently, areas 3, 4 have a higher wettability than area 2 and even attract the afore-mentioned conductive glue. The area 2 with the low wettability is adjacent to and located between the areas 3, 4 with the relatively high wettability.

As is shown in FIG. 2, an antenna 7 is formed on the top surface of the structured substrate 1. In this embodiment, the antenna 7 has a first electric contact end 8 and a second electric contact end 9, and the antenna 7 is plated on the top surface of the substrate 1, using a well-known plating process. Each of the two antenna contact ends 8, 9 has an area 10, 11 with a relatively high wettability so that they attract the afore-mentioned conductive glue (normally, the areas 10, 11 coincide with the antenna contact ends 8, 9. However, this is not a mandatory feature of the invention). Furthermore, the area 10 of the first contact end 8 borders the area 3 with the relatively high wettability and is spaced apart from the area 2 with the low wettability. The area 11 of the second contact end 9 borders the area 4 with the relatively high wettability and is spaced apart from the area 2 with the relatively low wettability.

Figure 5:
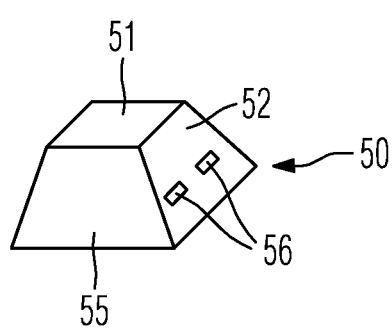
FIGS. 5 and 6 show different sides of an example of an integrated circuit used for the first transponder depicted in FIGS. 2 to 4.
Figure 6:
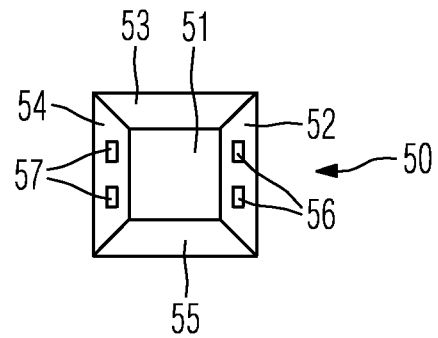

In a subsequent manufacturing step, which is illustrated in FIG. 3, an electric device, which is an integrated circuit 50 in this embodiment, is placed on the area 2 with the relatively low wettability. The integrated circuit 50 is depicted in more detail in FIGS. 5 and 6.

In this embodiment, the integrated circuit 50 has the shape of a frustum of a pyramid and comprises a top surface 51, a first side surface 52, a second side surface 53, a third side surface 54, a fourth side surface 55, and a bottom surface not shown in the Figures. Since the integrated circuit 50 has the shape of a frustum of a pyramid in this embodiment, the side surfaces 52, 53, 54, 55 are inclined with respect to the bottom surface. The side surface 52 is arranged opposite the side surface 54. The first side surface 52 comprises first electric contacts 56 and the third side surface 54 comprises second electric contacts 57 for electrically contacting the integrated circuit 50.

The integrated circuit 50 is placed on the area 2 with the relatively low wettability in such a way that the first side surface 52 comprising the first electric contacts 56 faces the first antenna contact 8, and the third side surface 54 comprising the second electric contacts 57 faces the second antenna contact 9. Additionally, the bottom surface of the integrated circuit 50 is dimensioned in such a way that it partly overlaps the two areas 3, 4 with the relatively high wettability when placed on the area 2 with the relatively low wettability, but without reaching the antenna contacts 8, 9.

After placing the integrated circuit on the area 2 with the relatively low wettability and partly on the areas 3, 4 with the relatively high wettability, a conductive glue 12 is applied on the areas 3, 4 with the relatively high wettability and on the antenna contact ends 8, 9 as shown in FIG. 4. Since the area 2 of the substrate 1 has a relatively low wettability and the areas 3, 4 of the substrate 1 as well as the areas 10, 11 of the two antenna contact ends 8, 9 have a relatively high wettability, substantially only the areas 3, 4, 10, 11 are wetted by the conductive glue 12. Moreover, the conductive glue 12 reaches the side surfaces 52 and 54 covering the first and the second electric contact 56, 67 of the integrated circuit 50, thus electrically coupling the integrated circuit 50 to the antenna 7. FIG. 7 is a side view of the transponder T1.

The conductive glue 12 has a certain surface tension and a certain weight. The conductive glue 12 thus substantially centers the integrated circuit 50 between the two antenna contacts 8, 9 while being wet. As a result, the bottom surface of the integrated circuit 50 partly covers the areas 3, 4 with the relatively high wettability but does not reach the two antenna contact ends 10, 11 of the antenna 7. Furthermore, the integrated circuit 50 is forced towards the substrate 1 because the surface tension and/or the weight of the conductive glue 12 acting on the inclined side walls 52, 54 also result in a force component towards the substrate 1.

Figure 8:
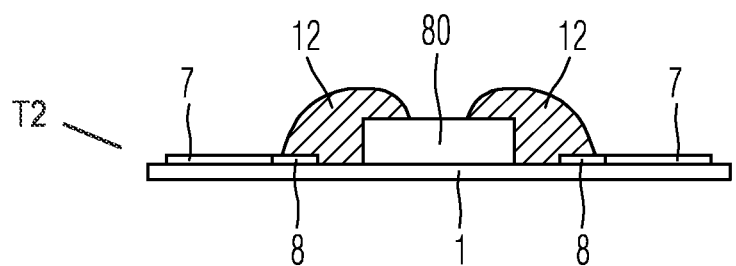
FIG. 8 is a side view of a second example of a transponder.

In the embodiment shown in FIGS. 1 to 7, the integrated circuit 50 of the transponder T1 is shaped as a frustum of a pyramid, wherein its bottom surface is larger than its top surface 51. Such an integrated circuit may also have a top surface which is larger than its bottom surface. Differently shaped integrated circuits may also be used. An embodiment of a transponder T2 having a differently shaped integrated circuit 80 is shown in FIG. 8. The integrated circuit 80 has a rectangular shape.

Figure 9:
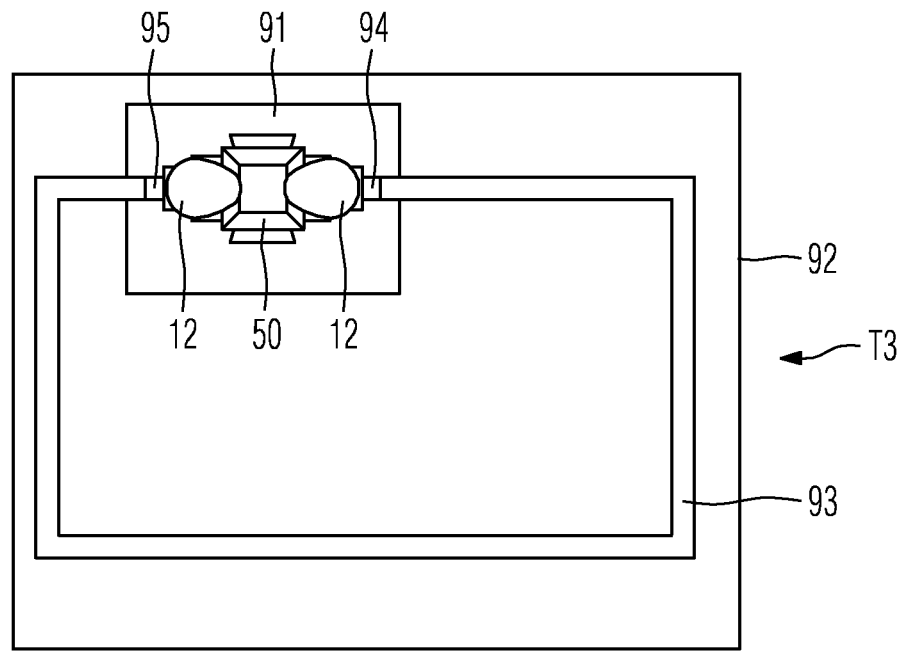
FIGS. 9 and 10 show the steps of manufacturing a third example of a transponder.

FIG. 9 shows a third embodiment of a transponder T3. Components of the transponder T3 that are substantially identical to components of the transponder T1 depicted in FIGS. 1 to 7 have the same reference signs.

The transponder T3 comprises an interposer substrate 91 and a main substrate 92. Both substrates 91 and 92 are made of PET in the embodiment shown. The main substrate 92 is provided with an antenna 97 formed by printing conductive ink on the top surface of the main substrate 92. The antenna 97 has a first contact end 94 and a second contact end 95.

Figure 10:
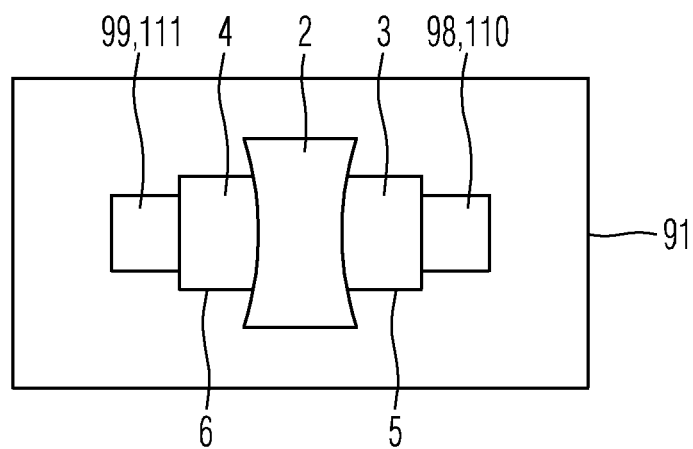

The interposer substrate 91 is shown in more detail in FIG. 10 and has a structure which is similar to that of the substrate 1 of the transponder T1. The interposer substrate 91 thus has an area 2 with a relatively low wettability located between two areas 3, 4 with a relatively high wettability. As is shown in FIG. 10, a first electric contact 98 and a second electric contact 99 are formed on the top surface of the interposer substrate 91, using a well-known plating process. Each of the two contacts 98, 99 has an area 110, 111 with a relatively high wettability so that they attract a conductive glue (normally, the areas 110, 111 coincide with the antenna contact ends 98, 99, which is, however, not a mandatory feature of the invention). Furthermore, the area 110 of the first electric contact 98 borders the area 3 with the relatively high wettability and is spaced apart from the area 2 with the low wettability. The area 111 of the second electric contact 99 borders the area 4 with the relatively high wettability and is spaced apart from the area 2 with the relatively low wettability.

When manufacturing the transponder T3, the integrated circuit 50 is placed on the area 2, and conductive glue 12 is applied to the areas 3, 4, 110, 111 in order to electrically couple the integrated circuit 50 to the electric contacts 98, 99. The interposer substrate 91, including the integrated circuit 50, is then mounted on the main substrate 92, and the first contact end 94 of the antenna 97 is electrically coupled to the first electric contact 98 of the interposer substrate 91. Likewise, the second contact end 95 of the antenna 93 is electrically coupled to the second electric contact 99 of the interposer substrate 91.

It should be noted that the invention applies to transponders having a coil antenna, a dipole antenna, or a monopole antenna, as well as to a transponder having any other antenna. Moreover, the invention is not only applicable to transponders, but also to other electronic devices which are attached to a substrate and preferably have two connectors. Examples are LEDs (active parts), switches (electromechanical parts), resistors, capacitors, and coils (passive parts). It will be evident to those skilled in the art that this is not an exhaustive list, and many other alternatives can easily be found. It should also be noted that the invention also relates to electronic devices having more than one or two connectors, e.g. an amplifier.

Finally, it should be noted that the above-mentioned embodiments illustrate rather than limit the invention, and that those skilled in the art will be capable of designing many alternative embodiments without departing from the scope of the invention as defined in the appended claims. In the claims, any reference signs placed in parentheses shall not be construed as limiting the claims. Use of the verb "comprise" and its conjugations does not exclude the presence of elements or steps other than those stated in any claim or the specification as a whole. The singular reference of an element does not exclude the plural reference of such elements, and vice-versa. In a device claim enumerating several means, several of these means may be embodied by one and the same item of hardware. The mere fact that certain measures are recited in mutually different dependent claims does not indicate that a combination of these measures cannot be used to advantage.

The invention claimed is:
1. A transponder comprising:
  a substrate which comprises a first area, a second area adjacent to said first area, and a first surface electrical contact attached on said substrate adjacent to said second area, and a third area adjacent to said first area, and a second surface electrical contact attached on said substrate adjacent to said third area, each of the second area and the first surface electrical contact being adjacent to neither the third area nor the second surface electrical contact;
  a conditioned said substrate such that said first area has a first wettability, said second area has a second wettability and said third area has a third wettability, said first wettability being lower than said second and said third wettability;
  an electrical device in or on said first area, wherein said electrical device has a lower surface, an upper surface and a plurality of side surfaces, at least one of which comprises electrical contacts; and a conductive glue on said second and third areas and/or on said first surface electrical contact and said second surface electrical contact so that said conductive glue automatically centers the electrical device and electrically couples said first and said second surface electrical contacts with to said electrical contacts of said electrical device.

2. The transponder as recited in claim 1, wherein said electrical device is in or on said first area without touching said first surface electrical contact.

3. The transponder as recited in claim 1, comprising cured conductive glue said cured conductive glue not pressing said electric device on said substrate.

4. The transponder as recited in claim 1, comprising said electrical device placed in or on said first area and at least partly on said second area.

5. The transponder as recited in claim 1, comprising said electrical device placed in or on said first area such that said side surface comprising said electrical contact faces toward said first surface electrical contact.

6. The transponder as recited in claim 1, wherein at least said side surface faces toward said first surface electrical contact is inclined with respect to said bottom surface of said electrical device.

7. The transponder as recited in claim 5, comprising said conductive glue applied at least partly on said electrical device.

8. The transponder as recited in claim 1, wherein said substrate has an antenna attached thereon, and said antenna comprises at least one antenna end being represented by said first surface electrical contact.

9. The transponder as recited in claim 1, wherein said substrate is a first substrate, said transponder further comprising:

said first substrate mounted on a second substrate on which an antenna with at least one antenna end is attached; and said first surface in electrical contact with said at least one antenna end.

* * * * *